United States Patent [19]

Oliver et al.

[11] Patent Number: 4,766,386

[45] Date of Patent: Aug. 23, 1988

[54] TIME DOMAIN REFLECTOMETER FOR MEASURING IMPEDANCE DISCONTINUITIES ON A POWERED TRANSMISSION LINE

[75] Inventors: Christopher J. Oliver, E. Rochester, N.H.; Frederick W. Sarles, Lexington, Mass.

[73] Assignee: Cabletron, E. Rochester, N.H.

[21] Appl. No.: 867,241

[22] Filed: May 23, 1986

[51] Int. Cl.$^4$ ............................................. G01R 27/04
[52] U.S. Cl. .............................. 324/533; 324/58.5 B; 324/527
[58] Field of Search .................... 324/58.5 B, 532, 533, 324/527

[56] References Cited

U.S. PATENT DOCUMENTS

| | | | |
|---|---|---|---|
| 4,404,514 | 9/1983 | Reichert | 324/533 |
| 4,475,079 | 10/1984 | Gale | 324/533 |
| 4,538,103 | 8/1985 | Cappon | 324/534 |

OTHER PUBLICATIONS

Network Tester Accents the Negative, Electronics Week, May 27, 1985, pp. 20 and 23.

Primary Examiner—A. D. Pellinen
Assistant Examiner—Leon K. Fuller
Attorney, Agent, or Firm—Wolf, Greenfield & Sacks

[57] ABSTRACT

A time domain reflectometer (TDR) for making impedance measurements on a powered transmission line cable system. The TDR is particularly useful for measuring impedance discontinuities on a powered Ethernet system. A negative test pulse is provided to ensure that any positive reflections do not exceed the upper voltage limit of the transceivers. The TDR selectively applies a negative bias to the transmission line cable below the collision detection threshold in order to disable all transceivers and prevent network interference with the TDR measurements. The negative DC bias also provides additional headroom for positive pulse reflections.

7 Claims, 2 Drawing Sheets

TIME DOMAIN REFLECTOMETER FOR MEASURING IMPEDANCE DISCONTINUITIES ON A POWERED TRANSMISSION LINE

BACKGROUND OF THE INVENTION

This invention concerns a time domain reflectometer for making impedance measurements on a transmission line cable system in the powered state.

High-fidelity transmission on an electromagnetic transmission line requires a lack of major impedance discontinuities. Thus, although transmission lines necessarily include bends, twists, joints, connectors and the like, the resulting impedance discontinuities caused thereby, as well as those caused by line damage, should be kept to a minimum. Transmission lines are periodically tested electrically in oroer to determine the nature, location, and amplitude of impedance discontinuities therealong and to determine whether these discontinuities are within desired limits.

Time domain reflectometry (TDR) is a well-known method for determining the general characteristics of impedance variations in a transmission line. In this method a test pulse or step waveiorm is transmitted down the line and the reflection from an impedance discontinuity is detected together with the time it takes for the pulse to reach the discontinuity and return. The location of the discontinuity is determined by observation of the elapsed time between the transmitted pulse and the reflected pulse. This technique is highly sensitive, revealing not only gross defects, such as open or short circuited cables ano terminations, but also revealing quite minute variations, e.g., cable impedance variations, frayed shields, and impedances introduced by making tap connections to the cable.

One prior art time domain reflectometry system is described in U.S. Pat. No. 3,434,049 to Frye. Frye discloses a current pulse source for producing a step wave voltage across the impedance of a transmission line which current source, because of its high output impedance, produces substantially no loading effect on the line and is therefore capable of driving lines of widely different characteristic impedance. A tunnel diode oscillator is used for delivering a rapid rise time current pulse to the transmission line with a minimum of circuitry.

Ethernet (trademark of the Xerox Corporation) cable systems have stringent requirements on cable impedance uniformity, termination matching, and maximum capacitance introduced at a transceiver tap. In addition, it is preferable to make TDR measurements on an Ethernet system which is powered up, since the impedance discontinuity introduced at a transceiver tap could differ between the powered and unpowered states.

Testing a powered Ethernet system imposes special constraints on the TDR apparatus to be used for measurements. FIG. 2 shows the pertinent voltages encountered on an Ethernet cable. Normal voltage limits for the transceiver attachment to the center conductor are 0 V (positive rail) and −6 V (negafive rail). Most transceiver designs can probably tolerate applied test voltages outside these rail limits for some brief time, but the voltage excess and time tolerance are highly dependant upon individual transceiver designs. Furthermore, even if the transceiver can tolerate excess voltages, the tap impedance may be altered if the applied voltage exceeds the rail voltages by more than a diode drop. Conversely, measurements made within the limits of the rail voltages plus a diode drop shoulo represent the true tap impedance.

The collision detection band of an Ethernet system lies from −1.40 V to −1.65 V. The average voltage from transmission by a single transceiver always lies above this band. If two transceivers are transmitting simultaneously, the average voltage from the overlapping pulsed transmissions will lie below the collision detection threshold of −1.40 V. When a transceiver detects an average voltage level below the collision detection threshold, the transceiver will cease transmission and retry after the collision voltage disappears. If an Ethernet cable system is to be tested in the powered state while the transceivers are transmitting information signals, one must avoid using a test pulse which in combination with a transmitted signal being received by a transceiver causes the average voltage level on the center conductor to drop below the collision detection threshold, thereby causing rejection of the received signal by the transceiver.

In general, positive test pulses greater than a few tenths of a volt cannot be used for testing a powered Ethernet cable system because the tap impedance measurements are not reliable when the voltage test pulse exceeds the upper rail margin, and furthermore, transceiver damage can result.

Therefore, it is an object of the present invention to provide an improved time domain reflectometer which permits impedance measurements to be made on a transmission line cable system in the powered state.

It is another object of this invention to provide a time domain reflectometer which generates negative test pulses wherein any positive reflections do not exceed the upper rail tolerance.

A still further object of this invention is to provide a time domain reflectometer which applies a negative DC bias voltage along with a negative test pulse to provide additional headroom for positive pulse reflections. Furthermore, the bias voltage conveniently allows all transceivers to be disabled from the TDR test site rather than at each interface site, wherein the disabling of the transceivers prevents network activity from obscuring the TDR measurements.

SUMMARY OF THE INVENTION

The present invention concerns a time domain reflectometer for characterizing impedance discontinuities on a powered transmission line cable system. The cable system includes a conductor to which at least one transceiver is attached. The transceiver can tolerate applied voltages from the center conductor between upper and lower voltage limits. If the applied voltage exceeds the upper voltage limit the tap impedance of the transducer on the center conductor will be distorted. In addition, the transceiver is disabled when the average voltage level falls below a collision detection threshold voltage which lies between the upper and lower voltage limits.

The time domain reflectometer includes a means for applying a negative voltage test waveform such as a pulse or step to the conductor which test waveform generates a return reflected waveform when an impedance discontinuity is encountered along the conductor. The reflectometer further includes means for selectively applying a DC bias voltage to the conductor of a value below the collision detection threshold in order to disable the transceiver and thus prevent network interference with the reflected waveforms and further to provide additional headroom for positive reflected waveforms. A means for displaying the return reflected waveform is provided to permit characterization of the impedance discontinuity. The location of the discontinuity is determined by observing the time between the transmitted and reflected waveforms, where the cable velocity of propagation is known. The shape and amplitude of the reflected waveform is used to characterize the type of impedance discontinuity.

In a preferred embodiment, the time domain reflectometer allows testing on a powered Ethernet network. The transceiver has an upper voltage limit of 0 V plus one diode drop, and a lower voltage limit of $-6$ V minus one diode drop. The reflectometer biases the Ethernet transmission line cable below the collision detection threshold so that all transceivers are disabled to prevent network interference with the test measurement and to provioe additional headroom for positive reflection pulses. A negative test pulse of from about 2 to about 3 V amplitude is used so that the reflections fall within the upper and lower voltage limits.

BRIEF DESCRIPITON OF THE DRAWINGS

FIG. 1 a schematic illustration of the time domain reflectometer of this invention connected to an Ethernet cable system.

DETAILED DESCRIPTION OF THE PREFERRED EMBODIMENT

Figure 1:
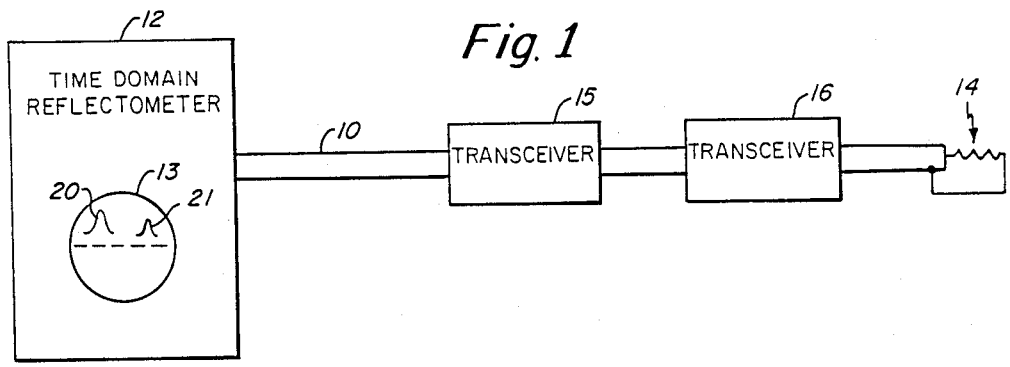

Referring to FIG. 1, a coaxial cable transmission line 10 under test having a characteristic impedance $Z_0$ is coupled at the input end thereof to the time domain reflectometer (TDR) 12 of this invention. The TDR 12 includes a pulse source, a bias source, and a detecting and display device such as an oscilloscope 13, or similar device portraying a high frequency signal with respect to a time base. Alternatively, the detecting and display device could be electronic circuitry coupled to a digital display device for producing a numerical readout of the impedance measurement.

The pulse source of the TDR (see FIG. 3) can be DC coupled directly to the cable or AC coupled via a capacitor to the cable. For Ethernet testing the pulse source is preferably DC coupled to the cable. The bias source of the TDR must be DC coupled to the cable. The TDR has an input impedance equal to $Z_0$, the characteristic impedance of the cable under test, and the cable is coupled across the input terminals of TDR apparatus. If the input impedance of the TDR is less than the characteristic impedance of the cable, $Z_0$, an additional impedance is desirably inserted at a point between the TDR and the cable. If the input impedance of the TDR is greater than the characteristic impedance of the cable, a suitable shunt resistance is connected across the terminals of the TDR.

The TDR provides a means for testing discontinuities and the like along a transmission line. In the preferred embodiment shown, the transmission line is illustrated as being terminated with a matched termination impedance 14 and transceivers 15 and 16 are attached along the length of the cable. The TDR is useful for measuring the tap impedances of transceivers 15 and 16. However, the present invention can also be used to locate and characterize all types of impedance discontinuities, including but not limited to a short circuit, an open circuit, an imperfect coupling, and a bend. The present invention is useful in determining both the position of this discontinuity impedance with respect to the input end of the transmission line and the magnitude of the discontinuity.

For determining the position of such a discontinuity, the TDR pulse source provides a negative voltage test pulse of rapid rise time. The test pulse is applied across the transmission line cable and travels down the transmission line from the input end towards the discontinuity impedance. At the discontinuity impedance, a reflected pulse is generated which propagates back towards the display apparatus.

The trace on the oscilloscope 13 in FIG. 1 is illustrative of the test pulse and reflected pulse with respect to a horizontal time base. The left pulse 20 represents the incident test pulse from the source which travels down the transmission line, and the right pulse 21 represents the reflected pulse returning back to the display means. In FIG. 1, the reflected pulse is indicative of a circuit discontinuity having a significantly higher impedance than $Z_0$.

The characteristic shape and amplitude of the reflection pulse is determined by the relative impedances $Z_1$ and $Z_0$ of the discontinuity impedance and the transmission line impedance. For discontinuities which are resistive so that $Z_1$ can be represented by $R_1$, the reflected pulse has the shape of the transmitted pulse and an amplitude equal in value to the fraction $$\frac{e_r}{e_i} = \frac{Z_1 + Z_0}{Z_1 - Z_0}$$

where $e_r$ and $e_i$ are the values of reflected and incident voltage pulses, respectively. The reflection $e_r$ passes unattenuated by the source as it returns down the line to be monitored at the display apparatus.

The location of the discontinuity impedance is found by noting the time difference between the incident pulse and the reflected pulse shown by the display apparatus. The time therebetween is equal to double the transit time of the length of the transmission line between the source and the discontinuity impedance, assuming the display apparatus is located substantially at the input end of the line.

The velocity of propagation of the transmission line, which is used in determining the location of the discontinuity, is conveniently determined from the characteristics of the dielectric used in its construction. For example, air dielectric has a velocity of propagation of approximately 30 centimeters per nanosecond (cm/ns) while polyethelene has a velocity of propagation of approximately 20 cm/ns. Velocity may be determined by the equation:

$$V = \frac{1}{e} \text{ (30) centimeters/nanosecond}$$

where V equals velocity and e equals the dielectric constant of the material used in construction of the insulating portion of the transmission line. For convenience of specification, velocity of propagation is often given as the relative propagation velocity with respect to an air dielectric transmission line. Although for purposes of illustration the transmission line is depicted as a coaxial cable, it is understood that the invention is adaptable to the testing of many other types of transmission lines including but not limited to such types as open wire, twisted pair, telephone cable, parallel flat conductor, etc., with coaxial cable being the usual example. The system is useful for testing transmission lines employing the TEM mode of propragation.

In determining the amplitude of the impedance discontinuity, the cable attenuation must be taken into account. Since cable attenuation is dependant on both pulse width and cable type, the correction factor must account for the particular combination pulse width and cable type under test.

The TDR pulse source (see FIG. 3) provides negative voltage test pulses at the output jack for application to the transmission line under test. Preferably the source provides a variety of different test pulse widths to permit the testing of cable systems having lesser bandwidths or longer cable lengths than those normally encountered on an Ethernet system. A typical short pulse has a 4 ns rise time (10-90%), a 5 ns fall time, and a 10 ns half amplitude width. The amplifier rise time of the oscilloscope must be taken into account when calculating reflections from reactive or distributed impedance discontinuities and the corresponding observed waveforms on the screen. Typical medium and long pulses are half sinusoids of 100ns and 500ns duration respectively. Rise and fall times of these pulses are sufficiently long that the effect of vertical amplifier rise time can be neglected.

The time domain reflectometer of the present invention is especially useful for making TDR measurements on an Ethernet cable system in the powered state. It is desirable to measure impedance discontinuities introduced at a transceiver tap in the powered state because the impedance can differ between the power and unpowered states.

Figure 2:
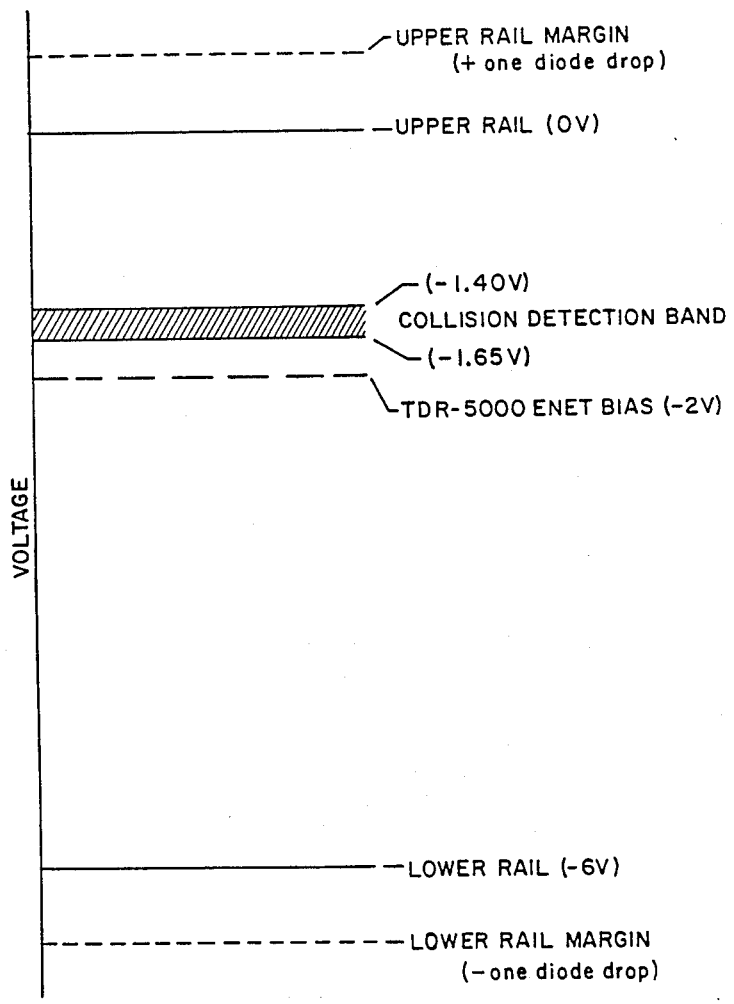
FIG. 2 is an illustration showing the respective voltage levels of an Ethernet cable system.

Testing a powered Ethernet system imposes special constraints on the TDR to be used for measurements. FIG. 2 shows the pertinent voltages encountered on an Ethernet cable. The normal voltage limits for the transceiver attachment to the center conductor are 0 V (positive rail) and −6 V (negative rail). Most transceiver designs can tolerate applied test voltages outside these rail limits for some brief time, however the voltage excess and time tolerance are highly dependant upon individual transceiver designs. Even if the transceiver can tolerate excess voltages, the tap impedance may be altered if the applied voltage exceeds the rail voltages by more than a diode drop. Conversely, measurements made within the limits of the rail voltages plus a diode drop, designated as the upper and lower rail margins in FIG. 2, and defined as the upper and lower voltage limits herein, should represent the true tap impedance. In this preferred embodiment the upper rail margin is about 0.7 volts and the lower rail margin is about −6.7 volts.

The collision detection band lies from −1.40V to −1.65 V. The average voltage from transmission by a single transceiver always lies above this band. If two transceivers are transmitting simultaneously, the average voltage from the overlapping pulse transmissions will lie below the collision detection band. When the average voltage level on the center conductor falls below the collision detection threshold (−1.40 V), a transceiver will cease transmission and retry after the collision voltage disappears.

Positive TDR pulses greater than a few tenths of a volt cannot be used for testing an unbiased Ethernet system because the test pulses would exceed the upper rail margin and the resulting impedance measurements would not be reliable. Furthermore, transceiver damage may result if the test pulse exceeds the upper rail margin. While it may be possible to bias the center cable conductor negative with respect to the upper rail to permit the use of a larger positive pulse amplitude, however, if one wishes the Ethernet to be operational the amount of bias which can be applied is limited because of the collision protection mechanism.

Therefore, it is preferable to use a negative pulse for Ethernet measurements to insure that any positive reflections do not exceed the upper rail margin. A negative test pulse of 2 to 3 V amplitude is suitable for Ethernet testing since most reflections encountered in actual measurements will be a small percentage of the initial pulse amplitude. The exception would be a very low impedance fault or short circuit. The reflection observed from such a gross fault may well be distorted. However, the energy content of the reflected pulse should be insufficient to cause transceiver damage and the fault location could still be appropriately determined. Obviously, such a fault would render the network inoperable and require corrective action before use of the network could be resumed.

Use of a short test pulse at a moderate repetition rate, e.g., 10 ns and 50 kHz will not cause collision detection on an active Ethernet system. While a test pulse could disturb a transmission packet and cause a transmission error, at the indicated repetition rate only one error can occur in a packet and providing parity protection built into the packet will prevent erroneous information transmission should such an overlap occur.

Although measurements can be made on an active Ethernet system using negative pulse techniques, network activity may obscure some measurements, particularly for observation of low amplitude reflections. By biasing the Ethernet transmission line cable below the collision detection threshold, it is possible to disable all transceivers. By providing such a biasing capability in the time domain reflectometer, all transceivers can be disabled from the TDR test site rather than having to resort to individual shut down operations at each interface site. In addition to eliminating network activity interference with TDR measurements, the negative biasing also provides additional headroom for positive pulse reflections. Thus, with a biased Ethernet system, measurements made under short circuit conditions such as previously discussed would not exhibit distortion.

Figure 3:
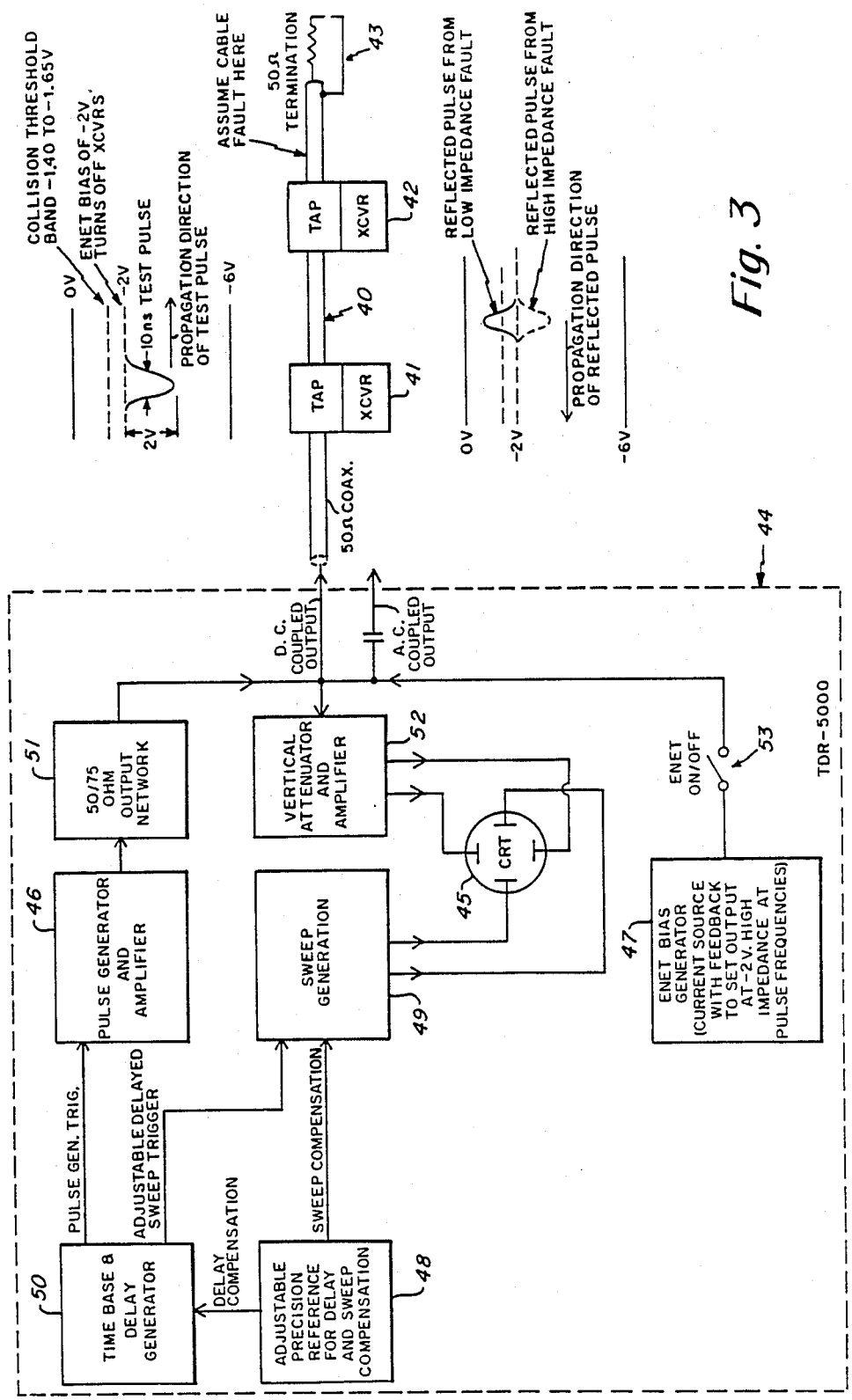
FIG. 3 is a schematic illustration of the time domain reflectometer circuit of this invention.

FIG. 3 shows a 50 ohm coaxial cable 40 having transceivers 41 and 42 disposed along its length, a 50 ohm termination inpedance 43 at its distal end, and the time domain reflectometer 44 of this invention connected at its proximal end. The TDR includes a cathode ray tube 45 as the display means, pulse source means 46 for applying a test pulse to the cable, and bias means 47 for selectively applying a DC bias voltage to the cable. An adjustable precision reference 48 sends a sweep compensation voltage to a sweep generator 49 and a delay compensation voltage to a time base and delay generator 50. The time base and delay generator 50 sends an adjustable delayed sweep trigger to the sweep generator 49 which in turn is coupled to opposing horizontal deflection plates of the cathode ray tube for generating the horizontal sweep signal. The time base and the delay generator 50 also sends a pulsed generator trigger signal to a pulse generator and amplifier 46 whose output signal is sent through a selectable source impedance 51 to the proximal end of the cable 40. The source impedance is selected at 50 ohms to match a 50 ohm cable under test, e.g., a Thicknet cable having a characteristic impedance of 50 ohms and a relative progagation velocity of 0.78, or a Thinnet cable having a characteristic impedance of 50 ohms and a propagation velocity of 0.66. The test pulse from the pulse generator and amplifier is also sent to the opposing vertical deflection plates of the cathode ray tube via a vertical attenuator and amplifier 52. Finally, a bias generator 47 is selectively DC coupled to the 50 ohm cable via an on/off switch 53. The bias generator consists of a current source controlled by a low frequency feedback loop to set its output at −2 V when coupled to the TDR output and cable. Being a high impedance at the test pulse frequency, the bias generator has no effect on the pulse or reflected signals.

By way of example, a test pulse is illustrated in FIG. 3 adjacent the proximal end of the cable. The bias generator 47, when the switch 53 is closed, biases the cable voltage at −2 V which turns off both transceivers 41 and 42. The pulse generator 46 applies a −2 V, 10 ns test pulse to the proximal end of the coaxial cable which test pulse propagates to the right down the cable. In this example neither transceiver generates an impedance discontinuity but rather a discontinuity in the cable is encountered by the test pulse to the right of the second transceiver. If the cable discontinuity is a low impedance fault, the reflected pulse will be positive as shown in the illustration. Conversely, if the cable fault is a high impedance fault, the reflected pulse from the fault will be negative as shown in dashed lines in the illustration. The reflected pulse propagates to the left toward the proximal end of the cable and is transmitted via the vertical attenuator and amplifier to the cathode ray tube. A determination of the location and amplitude of the reflected pulse is made via the information contained on the display screen.

Having described a preferred embodiment of the invention in detail, those skilled in the art will appreciate that numerous modifications may be made thereof without departing from the spirit of the invention. Therefore, it not intended that the scope of the invention be limited to the specific embodiment illustrated and described but rather it is intended that the scope of the invention be determined by the appended claims and their equivalents.

What is claimed is:

1. A time domain reflectometer for measuring impedance discontinuities on a powered transmission line system, the system including a conductor to which at least one transceiver is attached, the transceiver having safe operating limits defined by an upper voltage limit and a lower voltage limit and the transceiver being disabled when the average voltage level on the conductor falls below a collision detection threshold which lies between the upper and lower voltage limits, and wherein the tap impedance of the transceiver on the conductor is distorted if the upper voltage limit is exceeded, said reflectometer comprising:

source means for applying a negative voltage test waveform to the conductor which test waveform generates a return reflected waveform when an impedance discontinuity is encountered along the conductor;

bias means for selectively applying a DC bias voltage to the conductor of a value more negative than the collision detection threshold in order to disable the transceiver and thus prevent transmissions from the transceiver from interfering with the reflected waveform and to provide additional headroom for a positive relfected waveform without exceeding the upper voltage limit; and means for displaying the reflected waveform to permit measurement of the impedance discontinuity along the conductor.

2. The time domain reflectometer of claim 1, wherein the test waveform is a step.

3. The time domain reflectometer of claim 1, wherein the test waveform is a pulse.

4. The time domain reflectometer of claim 1, adapted for use on a powered transmission line system having a collision detection threshold more positive then −2 V and an upper voltage limit of no greater than about 0.7 V, wherein said DC bias voltage is at least about −2 V and the amplitude of the negative test waveform is no greater than about 3 V.

5. The time domain reflectometer of claim 4, wherein said negative test waveform is a pulse having an amplitude of about 2 V and said DC bias voltage is about −2 V.

6. The time domain reflectometer of claim 1, wherein said source means applies a test pulse of a predetermined width and at a predetermined repetition rate which will not cause the average voltage level on the conductor to fall below the collision detection threshold when the system is unbiased and the transceiver is transmitting.

7. The time domain reflectometer of claim 6, wherein said predetermined width is of from about 5 to about 50 nanoseconds and said predetermined repetition rate is of from about 1 to about 30 kHz.

* * * * *

UNITED STATES PATENT AND TRADEMARK OFFICE
CERTIFICATE OF CORRECTION

PATENT NO. : 4,766,386
DATED : August 23, 1988
INVENTOR(S) : Oliver et al.

It is certified that error appears in the above—identified patent and that said Letters Patent is hereby corrected as shown below:

Col. 1, line 17 - change "oroer" to -- order --

Col. 1, line 24 - change "waveiorm" to -- waveform --

Col. 1, line 32 - change "ano" to -- and --

Col. 2, line 2 - change "shoulo" to -- should --

Col. 3, line 19 - change "provioe" to -- provide --

Signed and Sealed this

Twenty-seventh Day of December, 1988

Attest:

DONALD J. QUIGG

Attesting Officer

Commissioner of Patents and Trademarks